United States Patent [19]

Yamamura

[11] Patent Number: 4,496,855
[45] Date of Patent: Jan. 29, 1985

[54] HIGH VOLTAGE LEVEL DETECTOR AND METHOD

[75] Inventor: Michael M. Yamamura, Cupertino, Calif.

[73] Assignee: Rockwell International Corporation, El Segundo, Calif.

[21] Appl. No.: 392,106

[22] Filed: Jun. 25, 1982

[51] Int. Cl.³ .................... H03K 5/153; H03K 5/24
[52] U.S. Cl. ................................ 307/350; 307/353; 307/354; 307/362
[58] Field of Search ............... 307/351, 350, 353, 354, 307/362; 340/662

[56] References Cited

U.S. PATENT DOCUMENTS 2,850,649  9/1958  Schroeder .

Primary Examiner—John Zazworsky
Attorney, Agent, or Firm—H. Fredrick Hamann; S. Alfred Uchizono

[57] ABSTRACT

A high-voltage sensing logic circuit for detecting the occurrence of an input signal level applied to the circuit which exceeds a predetermined threshold voltage level and for providing a unique output signal level in response thereto, the circuit adapted to operate over first and second time intervals from a voltage source providing supply and reference voltage levels wherein first and second chargeable devices with first terminals connected to form a common node are charged to substantially the supply voltage level at the common node during the first time interval. The first chargeable device has a second terminal to which is alternately applied reference and supply voltage levels during the first and second time intervals, respectively. The second chargeable device has a second terminal connected to a second node. During the second time interval, the common node voltage level is boosted above the supply voltage level or clamped to the supply voltage level in accordance with the input signal level being less than or exceeding the threshold voltage level, respectively, the boosting or clamping resulting in a high or unique low output signal level at the second node defined by the second terminal of the second chargeable device. Also provided is a method for detecting when the input signal level to a logic circuit exceeds a predetermined threshold voltage level and for providing a unique output signal level in response thereto comprising the steps of charging first and second chargeable devices to establish a voltage level substantially equal to the supply voltage level at a common node of the first and second chargeable device during a first time interval, and either elevating or clamping the voltage level of the common node relative to a supply voltage level in accordance with the input signal level either being less than or exceeding the threshold level, respectively, during a succeeding time interval to provide a high or unique low output signal level, respectively, at a second node defined by one terminal of the second chargeable device.

11 Claims, 2 Drawing Figures

HIGH VOLTAGE LEVEL DETECTOR AND METHOD

FIELD OF THE INVENTION

This invention is a novel structure and method for a high voltage level detector circuit which detects an input voltage exceeding a predetermined level and provides a unique output accordingly.

BACKGROUND OF THE INVENTION

In the computer field, particularly in the microprocessor field where circuits are developed as a portion of an integrated circuit, it has heretofore been necessary to employ a large number of devices, which consumes excessive space on the chip, in order to detect an input level to a logic circuit which is greater than normal. Thus, the subject invention relates to a circuit used as a mode switch for a test condition which is simplified, conserves space on the chip, and is accordingly much more reliable.

SUMMARY OF THE INVENTION

The subject invention is a logic circuit capable of and a method for providing a unique signal level at an output node for indicating excessive input signal level. This output node signal level, while useful, may also be fed through an inverter and transmission gate operating into a capacitive load to store a corresponding unique output level for indicating said excessive input signal level.

The principal of operation resides in charging a pair of chargeable devices, having their first terminals connected to a common node under control of a pair of non-overlapping bi-level clocks. One of the chargeable devices defines the output node on its other terminal, (i.e., terminal not connected to the common node). The other chargeable device has its other terminal connected to one of the clock inputs for periodically testing the circuit for any excessively high input signal level. When the excessive input signal level is encountered, the common node is clamped to the supply voltage, and a low occurs at the output node.

In a further embodiment, and particularly for use with capacitive load circuits, an inverter changes the low at the output node to a high and a clock operated transmission gate isolates this high at the output terminal.

DESCRIPTION OF THE PREFERRED EMBODIMENT

Figure 1:
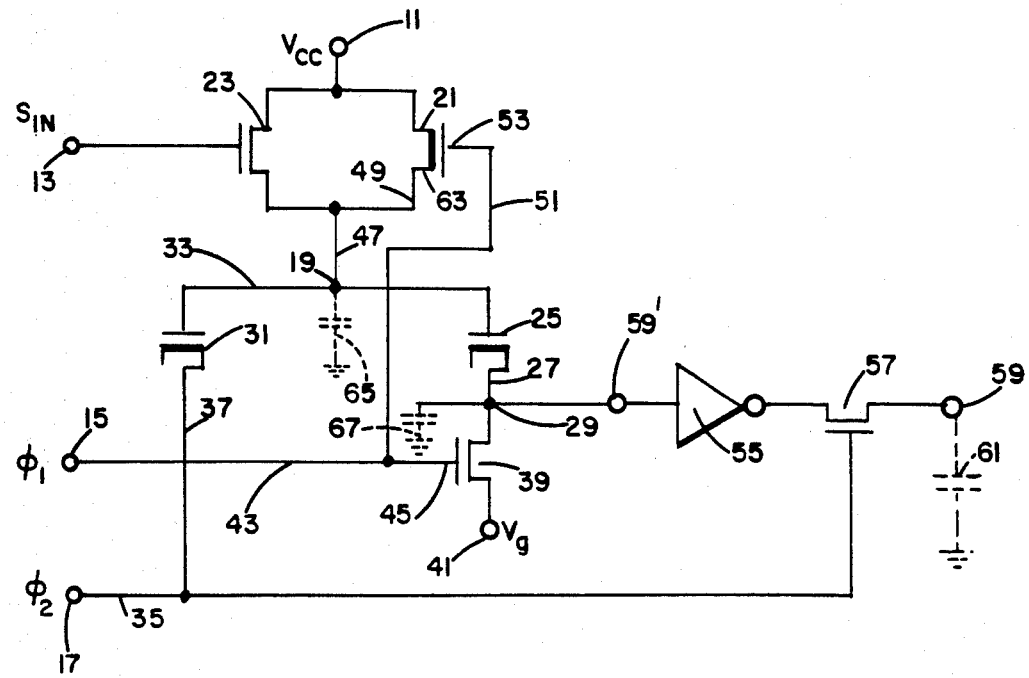
FIG. 1 is a circuit diagram of a preferred embodiment of the subject invention.

In a preferred embodiment of FIG. 1, the logic circuit comprises a supply voltage terminal 11, input signal terminal 13, a first clock signal input terminal 15, and a second clock signal input terminal 17. A parallel circuit is connected between the supply voltage terminal 11 and a first node indicated at 19. This parallel circuit includes a first field effect transistor (FET) 21 and a second FET 23. Preferably, FET 21 is a depletion-mode FET and FET 23 is an enhancement-mode FET, each FET having a gate and two conduction path terminals. FET 21 serves as a first switch means connected between supply voltage terminal 11 and the gate terminal of a first chargeable means, FET 25. FET 25 is a depletion-mode FET having a gate and at least a first conduction path terminal which first conduction path terminal is connected over lead 27 to second node 29. A second chargeable means, shown as depletion mode FET 31 having a gate and at least one conduction path terminal, is shown with its gate terminal connected over lead 33 to the first node 19 and one conduction path terminal connected to receive the second clock signal, $\phi_2$, from terminal 17 over common lead 35 and FET lead 37.

Figure 2:
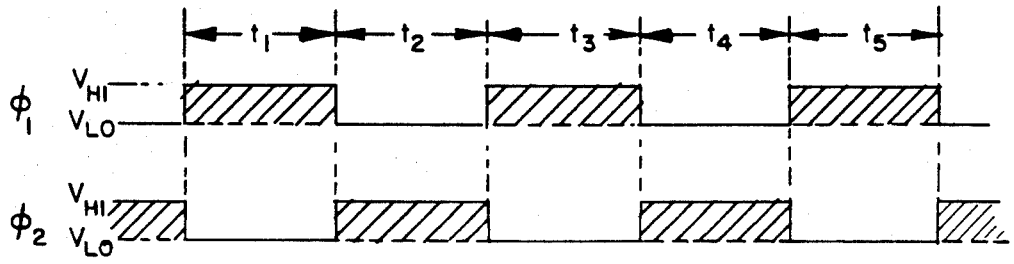
FIG. 2 is a schematic arrangement of a pair of clock signals used in the preferred embodiment of FIG. 1.

Using a depletion-mode FET 21 for the first switch means and an enhancement-mode FET 39 for a second switch means with each exhibiting negligible voltage drop in the switch closed (conductive) condition, the first chargeable means 25 will be charged to the voltage difference between the supply voltage ($V_{CC}$) at supply voltage terminal 11 and a reference voltage ($V_g$) (usually ground) at reference terminal 41 during the time interval $t_1$ when the first clock signal, $\phi_1$, is at its upper level, $V_{HI}$ (as shown in FIG. 2). This corresponds to a switch closed condition for FET 21 and FET 39. The second switch means FET 39, shown connected between the second node 29 and the reference terminal 41, is closed (conductive) during $t_1$ as a result of the first clock signal, $\phi_1$, being applied thereto over leads 43 and 45.

Also during the time interval $t_1$, the second chargeable means 31 is charged to the voltage difference between the supply voltage, $V_{CC}$, and the lower level, $V_{LO}$, of the second clock signal, $\phi_2$, applied thereto on lead 37. Preferably, the lower clock level, $V_{LO}$, is at the same potential as the reference potential, $V_g$. Where such is the case, the voltage to which the second chargeable means 31 is charged during the interval $t_1$ is substantially equal to the voltage to which the first chargeable means 25 is charged during the same time interval.

Next, during $t_2$ reversal of the first clock signal, $\phi_1$, conduction path terminal 63 of FET 21 connected to the first node 19 through leads 47 and 49 is at approximately $V_{CC}$ volts. When the first clock signal, $\phi_1$, goes to potential, $V_{LO}$, at gate 53 through leads 43 and 51, the depletion-mode FET 21 is turned off. This prevents current flow in the reverse direction if the first node potential 19 becomes more positive than that of the supply voltage terminal. Enhancement-mode FET 39 is also turned off during $t_2$ isolating the charge across the first chargeable means 25. Also during $t_2$, the second clock signal input, $\phi_2$, at terminal 17 becomes a positive going pulse equal to $V_{HI}-V_{LO}$, typically 5 volts. This positive going pulse is applied to the already charged second chargeable means 31 through leads 35 and 37 to elevate or boost the potential of the first node 19 to a value greater than that of the supply voltage $V_{CC}$ at terminal 11. Ideally, this boost in potential should be equal to $V_{HI}-V_{LO}$ or 5 volts for the typical case. However, because of the presence of stray capacitance, such as is shown for example at 65, the increase is somewhat less than ideal, resulting in a boost of approximately 4 instead of 5 volts for the typical case. Looking then to the potential of the second node 29, it, too, will also be elevated above the value to which it was set during $t_1$. In the ideal case, absent stray capacitances, this increase will be 5 volts. However, because of stray capacitances, shown at 65 and 67, the actual increase will be approximately 3 volts. Nevertheless, this level is still adequate to produce a high for this condition, where this condition is the absence of an excessively high input signal on input control terminal 13. The second node high is translated into a low by inverter 55, and transmission gate 57 passes this low to output terminal 59 during time interval $t_2$ when the transmission gate is conductive. Once the period $t_2$ expires, the transmission gate is turned off and the charge is trapped across the input capacity 61 of the circuit load for the logic circuit.

Now considering the condition for an input signal, $S_{IN}$, applied to control terminal 13, which exceeds the supply voltage $V_{CC}$ by approximately 1 volt, an amount which characterizes the threshold voltage of enhancement-mode FET 23, there is encountered the condition for which the unique outputs are desired for detection. During time interval $t_3$, the foregoing action of time interval $t_1$ is repeated, but during the time interval $t_4$, the effect of an excessively high level input signal, $S_{IN}$, is such as to turn on FET 23 and thereby provide a clamping action on the first node 19 to clamp it to the $V_{CC}$ potential in spite of the first node potential boosting action of the second clock voltage, $\phi_2$. This clamping action prevents the first node 19 from rising in potential and, consequently, the second node 29 reflects a low which is the unique condition sought. Inverter 55 changes the low to a high, and during the period $t_4$, this high is applied to the output terminal to charge the capacitor 61.

Thus, in examining the circuitry of FIG. 1 it will be seen that while the preferred embodiment includes the inverter 55 and transmission gate 57 for the output to be trapped on terminal 59, the same type output may be observed at output terminal 59' on a non-storable basis.

The above embodiment is illustrative of the invention and not restrictive, the scope of the invention being limited only by the appended claims.

What is claimed is:

1. A high-voltage sensing logic circuit for detecting the occurrence of an input signal level applied to said logic circuit which exceeds a predetermined threshold voltage level and for providing a unique output signal level in response thereto, said circuit adapted to operate over first and second time intervals from a voltage source providing supply and reference voltage levels at supply and reference voltage terminals, respectively, said circuit comprising:
   first and second chargeable devices having first terminals connected to form a common node, said first chargeable device having a second terminal to which is alternately applied reference and supply voltage levels during said first and second time intervals, respectively, and said second chargeable device having a second terminal terminating in a second node;
   means for charging said first and second chargeable devices to establish a voltage level substantially equal to said supply voltage level at said common node during said first time interval; and
   means for clamping said voltage level of said common node to said supply voltage level by providing a conductive path from said common node to said supply voltage terminal when said input signal level exceeds said predetermined threshold voltage level during said second time interval to provide a low at said second node which is said unique output signal level;
   said alternately applied reference and supply voltage levels to said second terminal of said first chargeable device causing the voltage level of said common node to be boosted above said supply voltage level if the input signal does not exceed said predetermined threshold voltage level during said second time interval to provide a high at said second node.

2. The high-voltage sensing logic circuit according to claim 1, in which said means for clamping said voltage level of said common node comprises an enhancement-mode field effect transistor (FET), having first and second conduction path terminals and a gate terminal, connected between said supply voltage terminal and said common node for providing said conductive path from said common node to said supply voltage terminal when said input signal level exceeds said predetermined threshold voltage level during said second time interval.

3. The high-voltage sensing logic circuit according to claim 1, in which said first and second chargeable devices comprise first and second depletion-mode field effect transistors (FETs), respectively, each of said FETs having a conduction path terminal and a gate terminal, said gate terminals connected to form said common node, and in which said conduction path terminal of said second FET is said second terminal of said second chargeable device.

4. The high-voltage sensing logic circuit according to claim 3, in which said means for charging said second depletion-mode FET comprises:
   a third depletion-mode field effect transistor (FET), having first and second conduction path terminals and a gate terminal, connected between said supply voltage terminal and said common node;
   a first enhancement-mode field effect transistor (FET) having first and second conduction path terminals and a gate terminal connected between said second node and said reference voltage terminal; and
   a signal source having an output signal applied to said gate terminals of said third depletion-mode FET and said first enhancement-mode FET to induce conduction therein during said first time interval and to prevent conduction therein during said second time interval.

5. The high-voltage sensing logic circuit according to claim 3, further comprising a signal source having an output signal applied to said conduction path terminal of said first depletion-mode FET, said signal source output signal characterized by having first and second voltage levels during said first and second time intervals, respectively, said first voltage level substantially the same as said reference voltage level and said second voltage level substantially the same as said supply voltage level.

6. The high-voltage sensing logic circuit according to claim 3, further comprising:
   a first signal source having a first output signal applied to said conduction path terminal of said first depletion-mode FET;
   said first output signal characterized by having first and second voltage levels during said first and second time intervals, respectively, said first voltage level substantially the same as said reference voltage and said second voltage level substantially the same as said supply voltage level;
and in which said means for charging said first and second depletion-mode FETs during said first time interval comprises:

a third depletion-mode field effect transistor (FET) having first and second conduction path terminals and a gate terminal, said third depletion-mode FET connected between said supply voltage terminal and said common node;

a first enhancement-mode field effect transistor (FET) having first and second conduction path terminals and a gate terminal, said first enhancement-mode FET connected between said second node and said reference voltage terminal; and a second signal source having a second output signal applied to said gate terminal of said third depletion-mode FET and to said gate terminal of said first enhancement-mode FET to induce conduction therein during said first time interval and to prevent conduction therein during said second time interval;

said second output signal characterized by having third and fourth voltage levels during said first and second time intervals, respectively, said third voltage level substantially the same as said supply voltage level and said fourth voltage level substantially the same as said reference voltage level.

7. The high-voltage sensing logic circuit according to claim 6, in which said means for clamping said voltage level of said common node comprises an enhancement-mode field effect transistor (FET), having first and second conduction path terminals and a gate terminal, connected between said supply voltage terminal and said common node for providing said conductive path from said common node to said supply voltage terminal when said input signal level exceeds said predetermined threshold voltage level during said second time interval.

8. The high-voltage sensing logic circuit according to claim 7, in which said circuit further comprises:

an output terminal; and inverter means and transmission gate means connected in series between said second node and said output terminal for providing said output voltage corresponding to said unique output signal level only when said input signal exceeds said threshold level;

said transmission gate means having a control terminal connected to receive said first output signal from said first signal source.

9. An overvoltage-sensing logic circuit, adapted to operate from a voltage source having supply and reference voltage terminals with supply and reference voltage levels provided thereon, respectively, and controlled by non-overlapping bi-level first and second clock signals with upper and lower voltage levels corresponding to said supply and reference voltage levels, respectively, for providing an output voltage corresponding to a unique logic state to a capacitive load at an output terminal in response only to an input signal applied to said circuit of a voltage level which exceeds a threshold voltage level which is substantially greater than said supply voltage level, said circuit comprising:

first chargeable means for storing charge;

means for charging said first chargeable means, said charging means comprising first and second switches connected in series with said first chargeable means between said supply and reference voltage terminals, and having a first node common to said first switch and said first chargeable means, and a second node common to said first chargeable means and said second switch;

said charging means charging the first chargeable means substantially to said supply voltage when said switches are closed;

said charging means further comprising first and second clock signal terminals for receiving said first and second clock signals, respectively;

means connecting said first clock signal terminal to each of said first and second switches for ensuring closing same when said first clock signal is in its upper voltage level;

second chargeable means for storing charge connected between said first node and said second clock signal terminal;

said second chargeable means being charged substantially to said supply voltage when said switches are closed and said second clock signal is in its lower voltage level;

means connected between said supply voltage terminal and said first node, and having an input control terminal adapted to receive said input signal for providing a conductive path between said supply voltage and said first node in response to said input signal when said input signal exceeds said threshold voltage level;

an inverter; and a transmission gate;

said inverter and transmission gate connected in series between said second node and said output terminal for providing said output voltage corresponding to said unique logic state at said output terminal only when said input signal exceeds said threshold voltage level;

said transmission gate having a control terminal connected to receive said second clock signal;

said output voltage stored in said capacitive load for evaluation at the time when said second clock signal is switched from said upper voltage level to said lower voltage level.

10. Method for detecting when the input signal level to a logic circuit exceeds a predetermined threshold voltage level and for providing a unique output signal level in response thereto, said circuit adapted to operate from a voltage source providing a supply voltage level at a supply voltage terminal, and a reference level, said method comprising the steps of:

charging first and second chargeable devices to establish a voltage level substantially equal to said supply voltage level at a common node during a first time interval;

elevating the voltage level of said common node if the input signal is less than said predetermined threshold voltage level to provide a high output at a second node directly connected to said second chargeable device during a succeeding time interval; and clamping the voltage level of said common node to the supply voltage level by providing a conductive path from said common node to said supply voltage terminal, when said input signal level exceeds said predetermined threshold voltage level during said succeeding time interval to provide a low at said second node which is said unique output signal level.

11. Method for detecting when the signal level of an input signal to a logic circuit exceeds a predetermined threshold voltage level and for providing a unique output signal level in response thereto, said circuit adapted to operate from a voltage source having a supply terminal at a supply voltage level less than said predetermined threshold voltage level, and a reference terminal at a reference voltage level, said method comprising the steps of:

charging first and second chargeable devices connected at their first terminals to a common node to pre-set the potential of said common node to a voltage level substantially equal to said supply voltage level during an initial time interval;

discontinuing said charging at the end of said first time interval;

increasing the potential of said common node, by an amount sufficient to establish a high condition at a second node connected through said second chargeable device to said common node, when the level of said input signal is less than said predetermined threshold voltage level during a succeeding time interval;

clamping said common node potential to said supply voltage level by providing a conductive path between said common node and said supply voltage terminal when said input signal exceeds said threshold voltage level during said succeeding time interval;

inverting the voltage level appearing at said second node to produce a further voltage level corresponding to an inverted logic state during said succeeding time interval;

gating said further voltage level to an output terminal during said succeeding time interval; and storing a voltage corresponding to said further voltage level in a capacitive load connected to an output terminal whereby said method provides a unique output voltage at said output terminal when said input signal level exceeds said threshold voltage level.

* * * * *